US008330111B2

(12) United States Patent
Öjefors et al.

(10) Patent No.: US 8,330,111 B2
(45) Date of Patent: Dec. 11, 2012

(54) MONOLITHICALLY INTEGRATED ANTENNA AND RECEIVER CIRCUIT FOR THE DETECTION OF TERAHERTZ WAVES

(75) Inventors: Erik Öjefors, Wuppertal (DE); Peter Haring Bolivar, Wenden (DE); Hartmut G. Roskos, Kronberg (DE); Ullrich Pfeiffer, Wuppertal (DE)

(73) Assignee: Johann Wolfgang Goethe-Universitat Frankfurt A.M., Frankfurt am Main (DE)

( * ) Notice: Subject to any disclaimer, the term of this patent is extended or adjusted under 35 U.S.C. 154(b) by 151 days.

(21) Appl. No.: 12/810,031

(22) PCT Filed: Dec. 12, 2008

(86) PCT No.: PCT/EP2008/067471
§ 371 (c)(1), (2), (4) Date: Sep. 14, 2010

(87) PCT Pub. No.: WO2009/080573
PCT Pub. Date: Jul. 2, 2009

(65) Prior Publication Data
US 2011/0001173 A1 Jan. 6, 2011

(30) Foreign Application Priority Data

Dec. 22, 2007 (DE) .......................... 10 2007 062 562

(51) Int. Cl.
*G01J 5/02* (2006.01)
(52) U.S. Cl. ................................ 250/341.1; 250/370.01
(58) Field of Classification Search .................. 250/330, 250/338.1, 338.4, 339.01, 339.06, 340, 341.1, 250/341.8, 370.01
See application file for complete search history.

(56) References Cited

U.S. PATENT DOCUMENTS

| 4,647,848 A | 3/1987 | Barrett |
| 2006/0081889 A1 | 4/2006 | Shur et al. |
| 2006/0239688 A1 | 10/2006 | Hillis et al. |

FOREIGN PATENT DOCUMENTS

JP 08204458 8/1996
(Continued)

OTHER PUBLICATIONS

"Wafer Level Integration of a 24 GHz Differential SiGe-MMIC Oscillator with a Patch Antenna using BCB as a Dielectric Layer" European Microwave Conference, 2003 3rd, IEEE, Piscataway, NJ USA, Oct. 1, 2003, pp. 293-296.

(Continued)

*Primary Examiner* — Mark R Gaworecki
(74) *Attorney, Agent, or Firm* — Paul and Paul

(57) ABSTRACT

The present invention relates to a device for detecting millimeter waves, having at least one field effect transistor with a source, a drain, a gate, a gate-source contact, a source-drain channel, and a gate-drain contact. Compared to a similar such device, the problem addressed by the present invention, among others, is that of providing a device which enables the provision of a field effect transistor for detecting the power and/or phase of electromagnetic radiation in the Thz frequency range. In order to create such a device, it is suggested according to the invention, that a device be provided which has an antenna structure wherein the field effect transistor is connected to the antenna structure in such a manner that an electromagnetic signal received by the antenna structure in the THz range is fed into the field effect transistor via the gate-source contact, and wherein the field effect transistor and the antenna structure are arranged together on a single substrate.

20 Claims, 17 Drawing Sheets

FOREIGN PATENT DOCUMENTS

Figure 1:
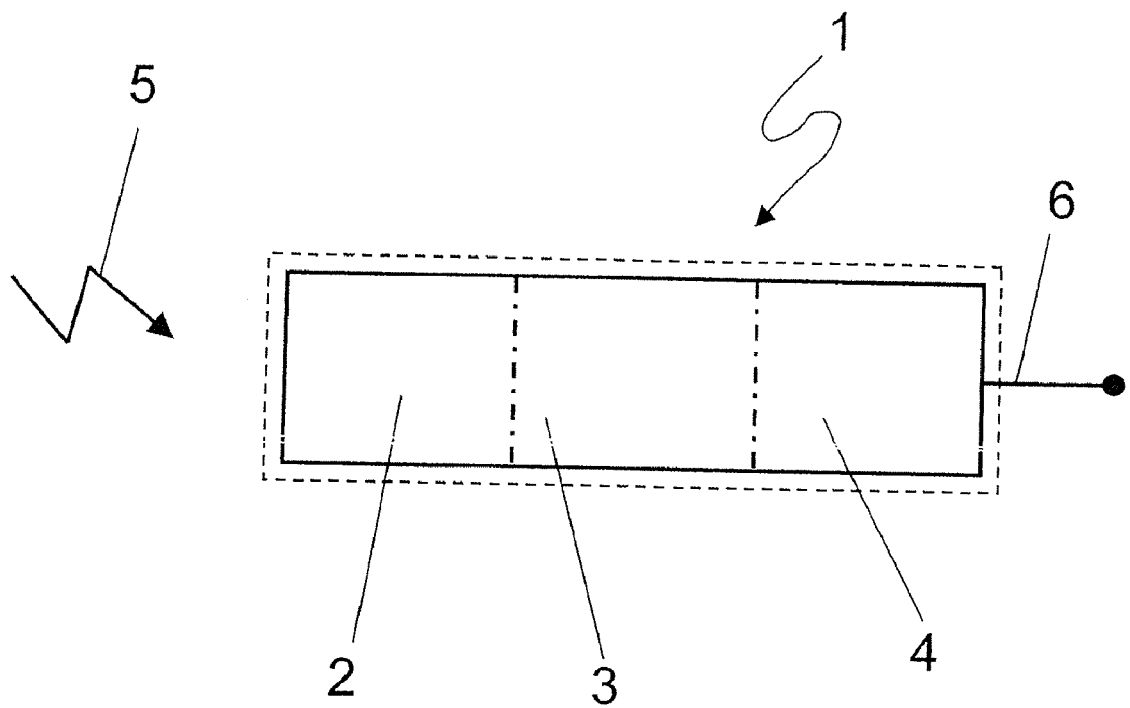

| | | |
|---|---|---|
| WO | WO03044941 A1 | 5/2003 |
| WO | WO2007126706 A2 | 11/2007 |

OTHER PUBLICATIONS

"Room temperature plasma waves resonant detection of sub-terahertz radiation by nanometer field-effect transistor" Applied Physics Letters, Aip, American Institute of Physics, Melville, NY USA, Bd. 87, Nr. 5 Jul. 27, 2005.

Plasma Wave Electronics: Novel Terahertz Devices using Two Dimensional Electron Fluid: IEEE Transactions on Electron Devices; vol. 43 No. 10 Oct. 1996 Michael I. Dyakanov and Michael S. Shur, Fellow IEEE.

"Plasma wave detection of terahertz radiation by silicon field effects transistors: Responsivity and noise equivalent power" Applied Physics Letters, AIP, American Institute of Physics, Melville, NY, US, Bd. 89, Nr. 25, Dec. 21, 2006.

"Subterahertz detection by high electron mobility transistors at large forward gate bias" Proceedings IEEE Lester Eastman Conference on High Performance Devices, Newark, DE Aug. 6-8, 2002 [Proceedings IEEEE/Cornell Conference on High Performance Devices], New York, NY: IEEE, US, Aug. 6, 2002.

"Terahertz detection by high-electron-mobility transistor: Enhancement by drain bias" Applied Physics Letters, AIP, American Institute of Physics, Melville, NY, US, Bd. 78, Nr. 17, Apr. 23, 2001 pp. 2587-2588.

MONOLITHICALLY INTEGRATED ANTENNA AND RECEIVER CIRCUIT FOR THE DETECTION OF TERAHERTZ WAVES

The present invention concerns an apparatus for the detection of millimeter waves comprising at least one field effect transistor which has a source, a drain, a gate, a gate-source contact, a source-drain channel and a gate-drain contact.

The terahertz frequency range or submillimeter wavelength range which is roughly defined as being between 100 GHz and 10 THz is one of the last 'dark' areas in the electromagnetic spectrum. In that frequency range technically usable, in particular coherent sources and corresponding detectors are hitherto not commercially available or are commercially available only at low frequencies. The developments in the last decades have resulted in complicated systems which by virtue of their complexity however are hitherto used only in experimentally distinguished areas such as radio astronomy or atmospheric research. Hitherto inexpensive sources and detectors are not available for applications in everyday life, that being although the THz frequency range has intrinsic advantages over other frequency bands in the electromagnetic spectrum:

many optically opaque materials are transparent in the THz frequency range,

THz radiation is non-ionising and is therefore deemed to be safe in the biomedical field, given rotatory, vibronic or libratory molecular excitations have a resonance frequency in the THz frequency range, THz radiation affords essential items of information about charge carrier dynamics, in particular in nanostructures, which play an essential part in future photonic and electronic components, THz radiation exhibits a lesser degree of scatter compared to optical frequencies and is therefore suitable in particular for use in industrial environments in which for example increased dust formation is involved, and if communication systems are considered higher frequencies permit greater transmission band widths.

Most purely electronic apparatuses operating in the THz frequency range are based on GaAs or InP semiconductor technology. It was shown in the end that SiGe and CMOS semiconductor technologies also result in apparatuses operating at up to 100 GHz. At higher frequencies up to 1 THz and above complex quantum cascade laser systems are used equally as sources as optoelectronic systems based on femtosecond short pulse lasers or mixing of two continuous-wave laser sources.

At the present time the THz radiation is detected with heterodyne mixers, for example Shottky diode mixers, photoconductive detectors or power detectors such as for example photovoltaic detectors, bolometers or Golay cells.

All the above-described technologies however involve considerable complexity in the source and detector components themselves as well as the manufacture thereof so that although they are admittedly used in the field of research and development and in research-related fields of application such as radio astronomy, they are not suitable for mass markets.

U.S. Pat. No. 4,647,848 discloses a field effect transistor circuit used to detect the power level of a radio frequency signal. The described receiver circuit is made up of discrete elements so that it does not permit high levels of integration density on a chip. In addition by virtue of its long time constant determined by the transit times of the charge carriers through the field effect transistor, it is not suitable for high frequencies in the THz frequency range. The receiver circuit described in the aforementioned U.S. Pat. No. 4,647,848 uses a field effect transistor as a so-called resistive mixer. For that purpose the radio frequency signal is coupled into the drain of the field effect transistor and the gate of the field effect transistor is biased with a dc voltage, wherein the output signal is filtered with a low pass filter so that the signal strength of the resulting direct current downstream of the low pass filter is proportional to the power of the radio frequency signal. Circuitry arrangements which permit mixing of the signal to be received, with a local oscillator, are not described.

In comparison the object of the present invention is inter alia to provide an apparatus which makes it possible to afford a field effect transistor for detection of the power and/or phase of electromagnetic radiation in the THz frequency range.

In addition a possible object of the present invention is to provide an apparatus permitting a high level of integration density of the detector components.

A further object of the invention is to provide an apparatus which can be produced by means of conventional semiconductor technologies so that the apparatus is suitable for mass markets.

At least one of the aforementioned objects is attained by an apparatus for the detection of electromagnetic radiation in the THz frequency range comprising at least one field effect transistor which has a source, a drain, a gate, a gate-source contact, a source-drain channel and a gate-drain contact, and an antenna structure, wherein the field effect transistor is so connected to the antenna structure that an electromagnetic signal received by the antenna structure in the THz frequency range is fed into the field effect transistor by way of the gate-source contact, and wherein the field effect transistor and the antenna structure are arranged together on a single substrate.

In that respect a frequency range of between 100 GHz and 10 THz is interpreted as being the THz frequency range in accordance with this invention.

Coupling-in of the electromagnetic signal received by the antenna structure by way of the gate-source contact of the field effect transistor permits efficient coupling of the received high frequency signal to the field effect transistor provided for the detection of amplitude and/or phase of the received signal. To improve that coupling-in effect the high frequency boundary conditions of the transistor can be optimised as discussed hereinafter.

Integration of the transistor and the antenna structure together on a single substrate permits a high integration density in the combination of a plurality of apparatuses according to the invention to form a line-shaped or two-dimensionally flat detector.

Integration of the transistor and the antenna structure on a single substrate in addition makes it possible, by virtue of the short or non-existent spacings between the antenna structure and the field effect transistor, to avoid transport losses which otherwise inevitably occur in the transmission of the THz signal received by the antenna structure to the transistor.

The integration of the antenna structure and the field effect transistor on a single substrate however requires a re-design of the overall apparatus having regard to the interactions which occur due to the spatial proximity of the antenna structure and the field effect transistor between the two elements, as are described in greater detail hereinafter.

In an embodiment the field effect transistor and the antenna structure are monolithically integrated on a single chip, that is to say on a single piece of a semiconductor material, for example of silicon.

In an embodiment the antenna structure has a connection directly connected to the gate of the field effect transistor.

That permits direct coupling of the THz radiation into the field effect transistor without transport losses, wherein direct coupling also permits optimum impedance matching between the antenna and the field effect transistor.

In an embodiment the field effect transistor is a metal insulator semiconductor field effect transistor (MISFET), in particular a metal oxide semiconductor field effect transistor (MOSFET). In particular the field effect transistor used is a linear component.

In an embodiment of the invention the field effect transistor is a so-called plasma field effect transistor.

US patent application No 2006/0081889 A1 and the technical article by M Dyakonov and Michael Shur, 'Shallow Water Analogy for a Ballistic Field Effect Transistor: New Mechanism of Plasma Wave Generation by dc Current', Appl Phys Let, volume 71, No 15, pages 2465 through 2468, October 1993, and M Dyakonov and M Shur, 'Plasma Wave Electronics: Novel Terahertz Devices using Two Dimensional Electron Fluid', IEEE Transactions on Electron Devices, volume 43, No 10, October 1996 disclose metal oxide semiconductor field effect transistors (MOSFETs) which are produced by means of inexpensive semiconductor structuring methods such as for example CMOS or bipolar SiGe technologies in order to implement receiver circuits for operation at THz frequencies.

Such field effect transistors (FET) can be electrically biased and connected in such a way that they operate in a regime which is referred to hereinafter as a plasma field effect transistor in which electron-electron collisions dominate the charge carrier transport characteristics and the electrons in a field effect transistor channel behave as a two-dimensional electron fluid instead of a two-dimensional electron gas. The electron movement in the field effect transistor channel can then be described by equations which are known from the hydrodynamics of shallow water waves. The speed of the plasma waves is much greater than the drift speed of a two-dimensional electron gas in a field effect transistor channel. The propagation of plasma waves in a field effect transistor can therefore be used for the operation of the field effect transistor in a regime which allows much higher frequencies than conventional field effect transistors whose frequency characteristics are defined by the classic transit time of charge carriers through the channel of the field effect transistor.

So that electron transport in a field effect transistor operates in the manner of a plasma field effect transistor the field effect transistors must comply with two essential boundary conditions.

1) The electromagnetic signal received by the antenna structure in the THz frequency range must be fed into the field effect transistor by way of the gate-source contact; and 2) by way of the source-drain contact, at the THz target frequency, that is to say the resonance frequency of the antenna structure, the field effect transistor must have an impedance which is as high as possible.

Field effect transistors which fulfil those boundary conditions are referred to hereinafter in accordance with the present invention as plasma FETs.

When an electromagnetic wave is coupled into the channel of an FET, which fulfils the above-specified boundary conditions, a constant source-drain voltage is induced. In a channel with high charge carrier mobility, that constant source-drain voltage has a resonant dependency on the frequency of the irradiated electromagnetic radiation, wherein the resonance frequency is proportional to the root of the surface charge carrier density and inversely proportional to the gate length. With the gate lengths and carrier densities achievable by modern semiconductor process technologies it is possible for the plasma frequency of the plasma field effect transistors to reach the THz frequency range.

The plasma field effect transistors can operate under two different operating conditions. Firstly there is a resonant ballistic mode of operation which can be acquired in apparatuses with a short channel. Apparatuses with a long channel can in contrast be operated in an overdamped mode of operation. While in the overdamped mode of operation the detector response is a flat function of the frequency of the irradiated electromagnetic radiation so that this mode is suitable in particular for wide band detectors the ballistic mode of operation leads to structures which are resonant to a high degree.

All previous publications relating to plasma FETs show theoretically or experimentally the basic possibility of implementing THz detectors on the basis of plasma FETs, but without specific suggestions for practical implementation of structures optimised for the detection of electromagnetic radiation in the THz frequency range.

In an embodiment the kind of feed of the field effect transistor with the high frequency signal, that is required as the first condition for a plasma field effect transistor, can be fulfilled by the gate-source contact having a high-frequency short-circuit for the plasma wave which is propagated in the channel.

In addition in an embodiment a field effect transistor additionally complies with the second boundary condition which is also referred to as a drain which is open (for the plasma wave). That boundary condition for the plasma wave in the transistor is implemented in an embodiment by a high impedance at the THz target frequency at the source-drain contact. In that respect in an embodiment the high-frequency impedance of the source-drain contact is greater than 1 MΩ. In an embodiment the high impedance at the source-drain contact is produced externally, that is to say by the circuit and not by the transistor itself. Alternatively or additionally that load impedance of the source-drain contact can be afforded intrinsically, that is to say in the transistor, for example by a semiconductor-metal junction.

In a further embodiment, besides the above-mentioned first boundary condition and alternatively or additionally to the second boundary condition there can be a capacitance at the gate-drain contact so that the voltage at the gate follows the voltage at the drain.

A field effect transistor having such a gate-drain capacitance can operate as a so-called resistive mixer without necessarily fulfilling all boundary conditions for a plasma field effect transistor.

In that respect the capacitance of the gate-drain contact can be an external capacitance, for example a capacitor which is connected to the terminals of the gate and the drain. Alternatively or additionally the gate-drain contact can have an intrinsic gate-drain capacitance.

In an embodiment the gate-drain capacitance is greater than the intrinsic capacitance of the gate-source contact.

In an embodiment the gate-drain capacitance is greater than 100 fF.

In an embodiment the intrinsic capacitance of the gate-drain contact is increased by the gate contact of the gate and the drain contact of the drain being arranged above or beneath each other in such a way that they mutually spatially overlap. In that way, due to the insulation between the gate and drain contacts, there is provided a plate capacitor, the capacitance of which depends on the spatial overlap of the contacts.

In an embodiment of the invention the drain of the field effect transistor is connected to an impedance matching element, preferably to a wave line (or transmission line). Such an impedance matching element makes it possible to adjust the high impedance of the drain and thus to comply with the second required boundary condition for the operation of a plasma field effect transistor.

In an embodiment of the invention the apparatus has two field effect transistors which are alternatively connected in series or in parallel.

In the case of a series circuit, in an embodiment, the drain of a first transistor is connected to the source of a second transistor so that they permit increased detection efficiency of the apparatus by cascading.

In a parallel arrangement of the field effect transistors the sources of the two transistors are connected together. In that case the sources are advantageously connected to an additional ac ground to improve coupling of the electromagnetic wave in the THz frequency range into the gate or to satisfy the short-circuit boundary condition for the plasma wave in a transistor operated as a plasma field effect transistor. The ac ground connected to the sources can also serve as a bias voltage for a subsequent amplifier stage.

In an embodiment the antenna structure has two terminals which are respectively connected to the gate of one of two field effect transistors so that the field effect transistors are driven differentially by the electromagnetic wave received with the antenna structure. In an embodiment, for that differential mode, the sources as well as the drains of the two field effect transistors are connected together and feed the two inputs of a differential amplifier.

In an embodiment of the invention the antenna structure has a plurality of and preferably two mutually different receiving bands. In that case in an embodiment the antenna structure is preferably so adapted that it receives two modes of electromagnetic radiation, preferably involving crossed polarisation. In that way it is possible to implement a receiver apparatus which simultaneously detects two electromagnetic waves of differing frequency and/or differing polarisation and mixes them in the field effect transistor. Such an arrangement permits in particular the implementation of a heterodyne receiver, wherein, besides the actual electromagnetic radiation to be received, the signal of a local oscillator is radiated into the antenna.

In a further embodiment the antenna structure is connected to a voltage source which by way of the antenna structure provides the bias voltage for the gate of the field effect transistor.

As the antenna is directly connected to the sensitive gates of the field effect transistors an embodiment of the apparatus according to the invention has a device for protection for the field effect transistor for overvoltage and discharge damage, preferably one or more diodes connected to the antenna structure and to ground.

In that respect it is desirable if the device for the protection of the field effect transistor for overvoltage and discharge damage is so arranged that it does not load the apparatus and in particular the field effect transistor with additional parasitic influences. For that purpose in an embodiment of the invention the device for the protection of the transistor is connected to a point on the antenna structure, at which the ac voltage induced in relation to a ground plane of the apparatus is zero.

In an embodiment of the invention such an antenna structure is a folded dipole antenna. It has both a point at which the ac voltage induced in relation to a ground plane of the apparatus is zero, but it also permits the reception of two perpendicular resonant modes at the same frequency.

Therefore in an embodiment the dipole antenna has a third branch serving for impedance matching of the antenna to the transistor.

In a further embodiment a further monopole is connected to the point of symmetry of the dipole antenna, which permits the reception of the second mode.

Alternative antenna structures suitable for the apparatus according to the invention are patch antennas, ring antennas, slot antennas or notch antennas.

In an embodiment the antenna structure has a metallic screening in relation to the substrate. It is desirably arranged at a spacing from the antenna structure, for example separated therefrom by an oxide layer.

To permit a high integration density of a plurality of apparatuses according to the invention on the single substrate it is desirable for the amplifier circuit, in particular a differential amplifier, to be integrated on the same substrate as the antenna structure and the field effect transistor.

In addition in an embodiment of the apparatus according to the invention further circuits which serve for operation of the apparatus are integrated on the substrate. That can be for example a bias voltage circuit, a detector circuit which is preferably connected downstream of the amplifier circuit, a mixer circuit or a high frequency source as a local oscillator.

The various embodiments of the above-described apparatus for the detection of electromagnetic radiation in the THz frequency range is suitable in particular for the implementation of a THz heterodyne receiver which mixes the electromagnetic signal to be received with a local oscillator. Such a THz heterodyne receiver is suitable in particular for use in an imaging system, in a radar system or in a communication system.

Further advantages, features and possible uses of the present invention will be apparent from the description hereinafter of a number of embodiments and the accompanying Figures.

Figure 2:
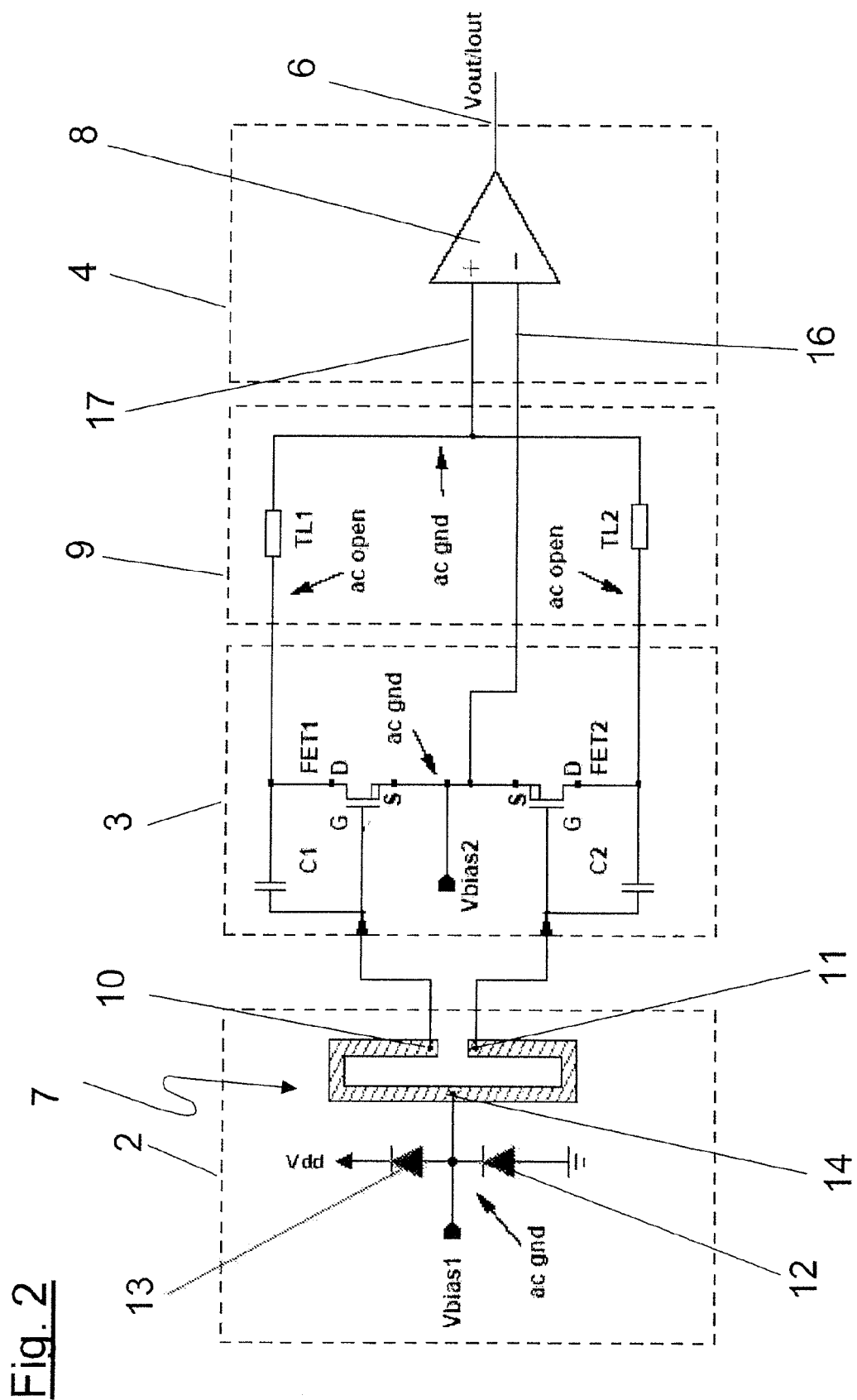
Figure 3A:
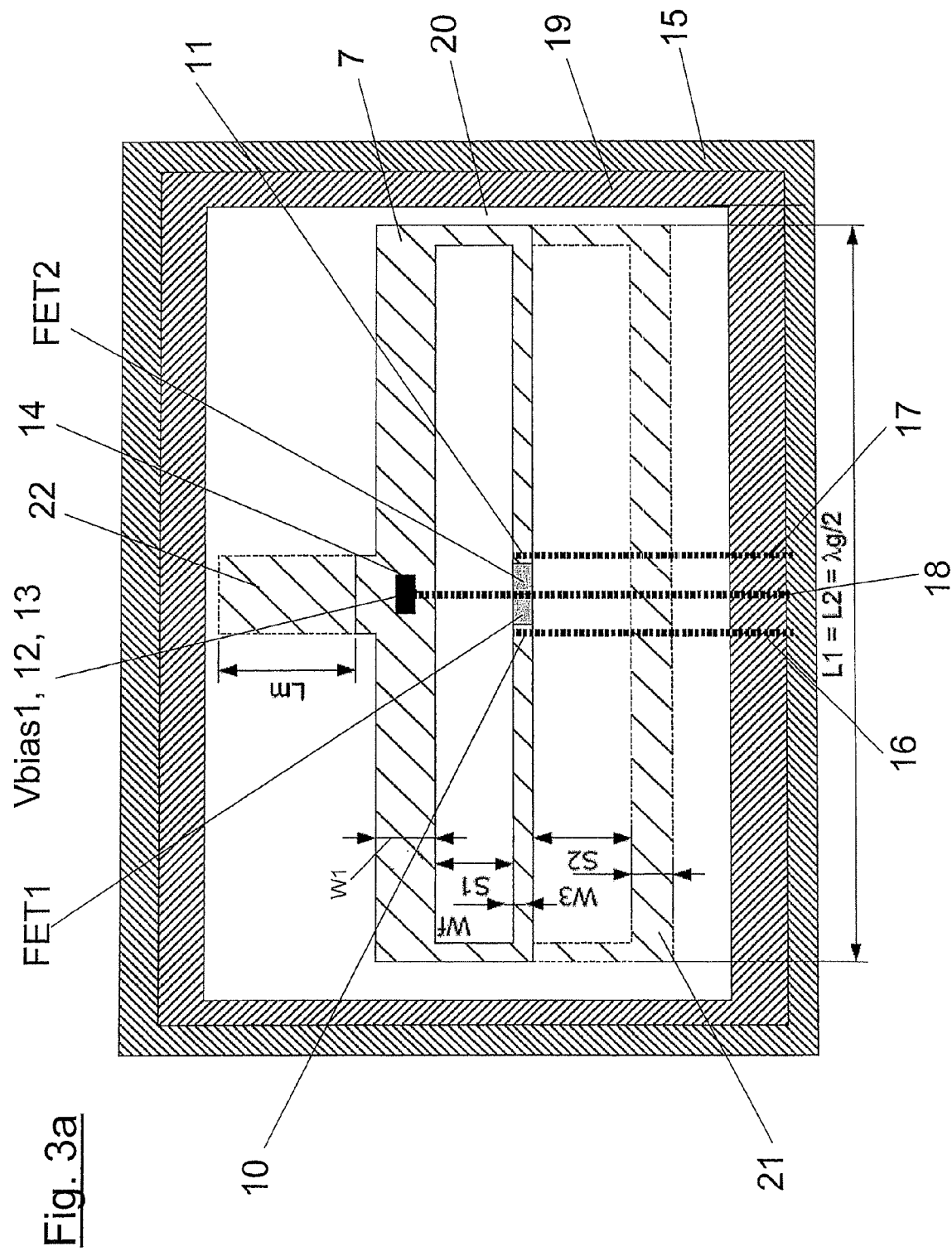
Figure 3B:
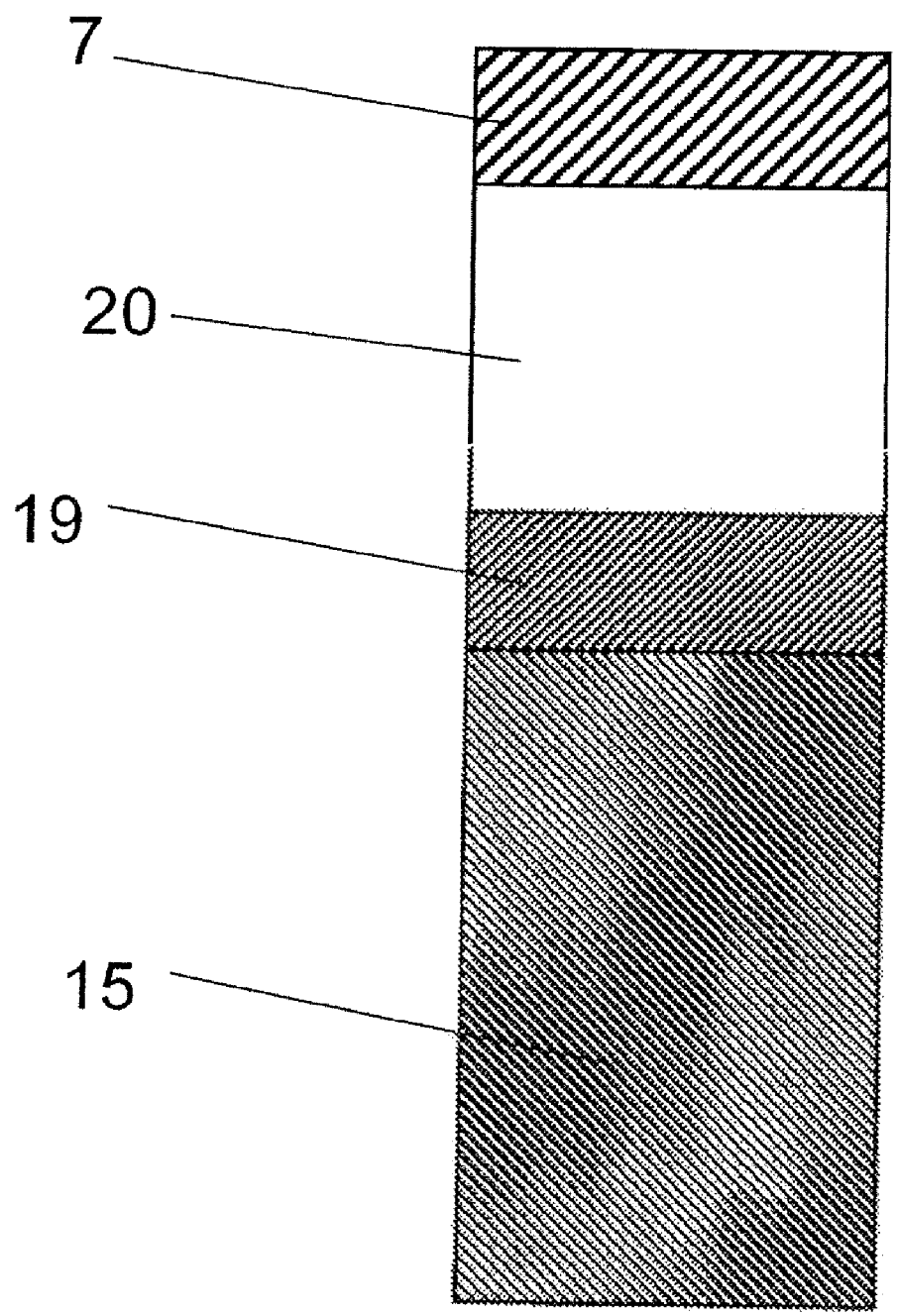
Figure 4:
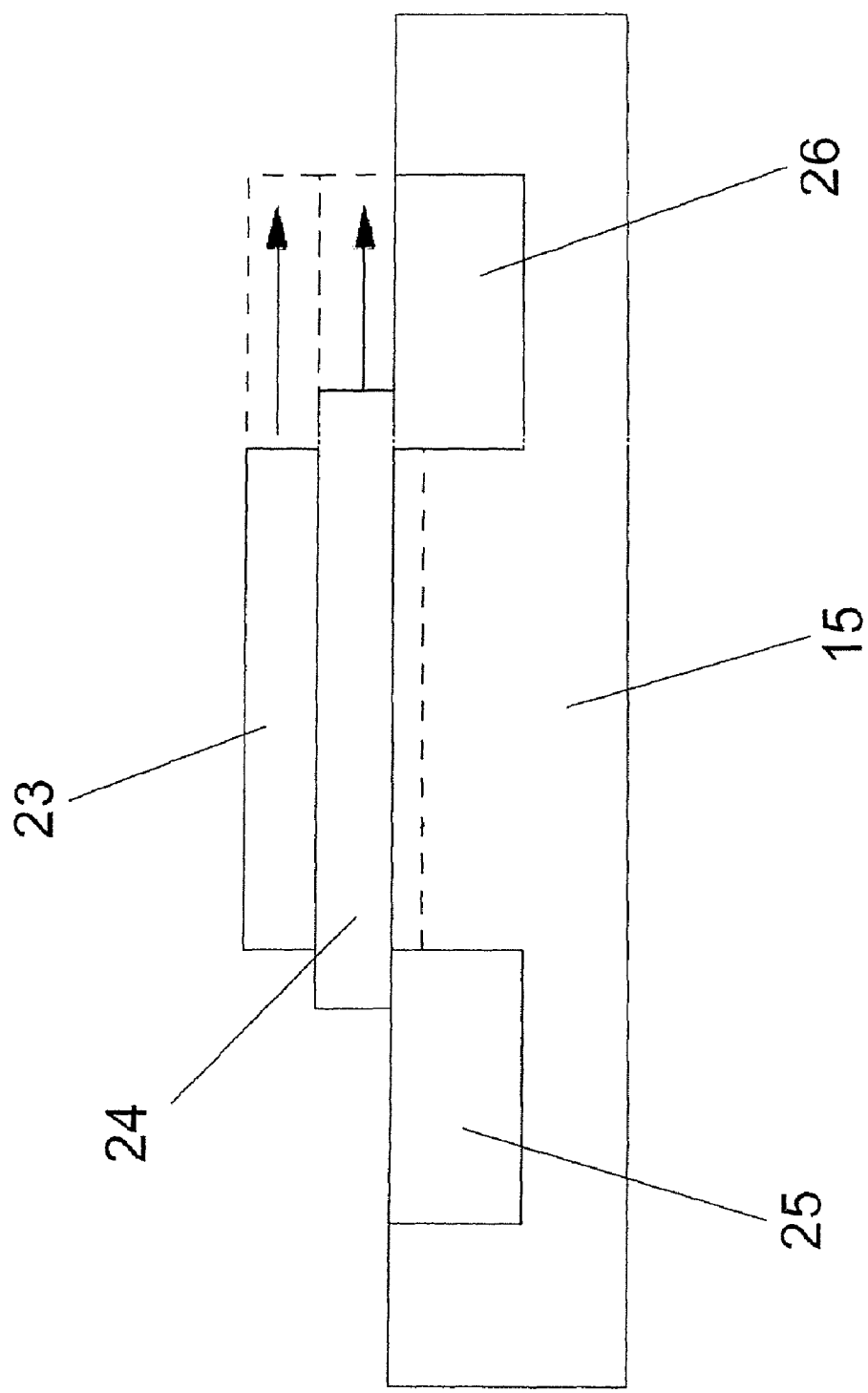
Figure 5:
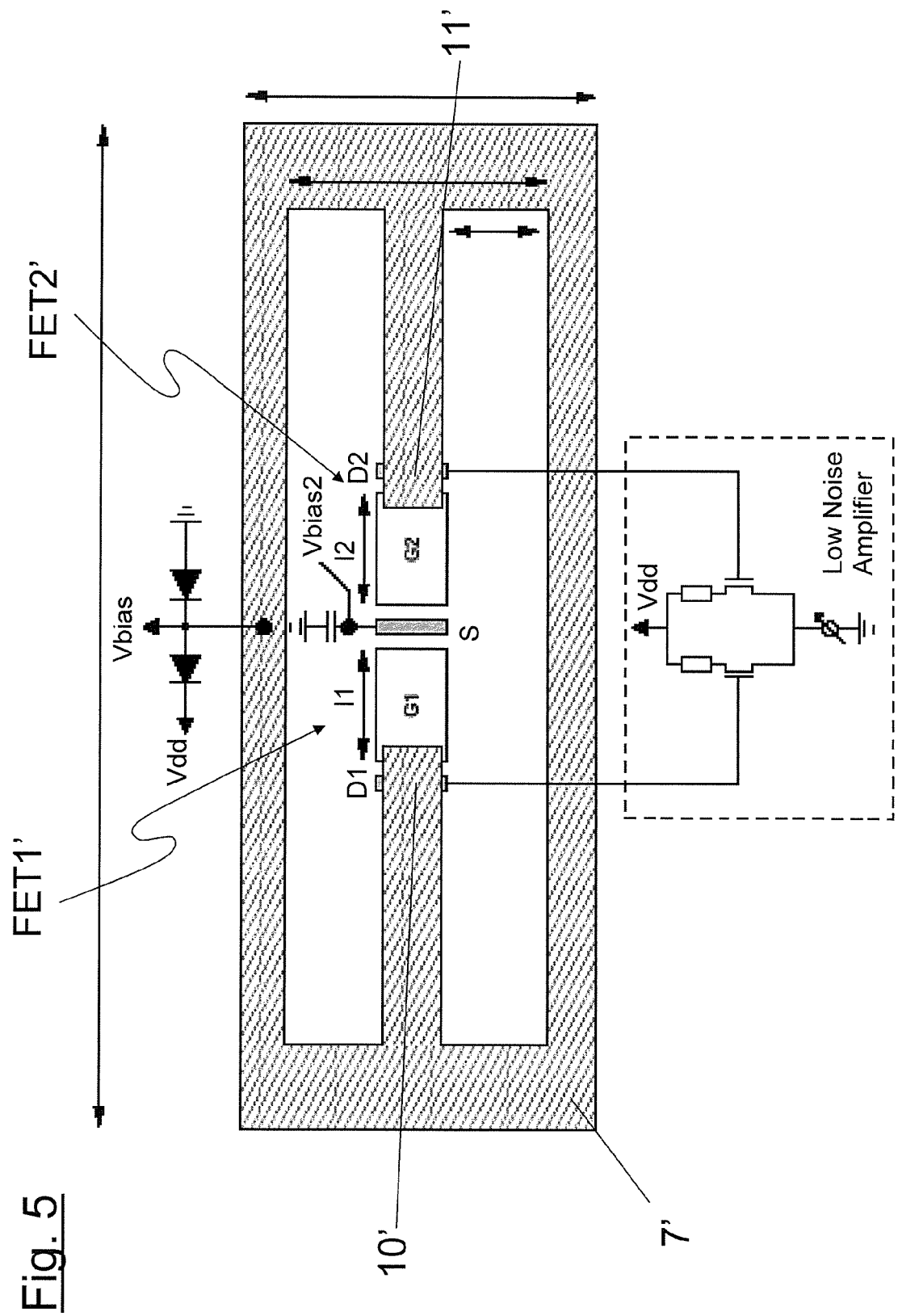
Figure 6:
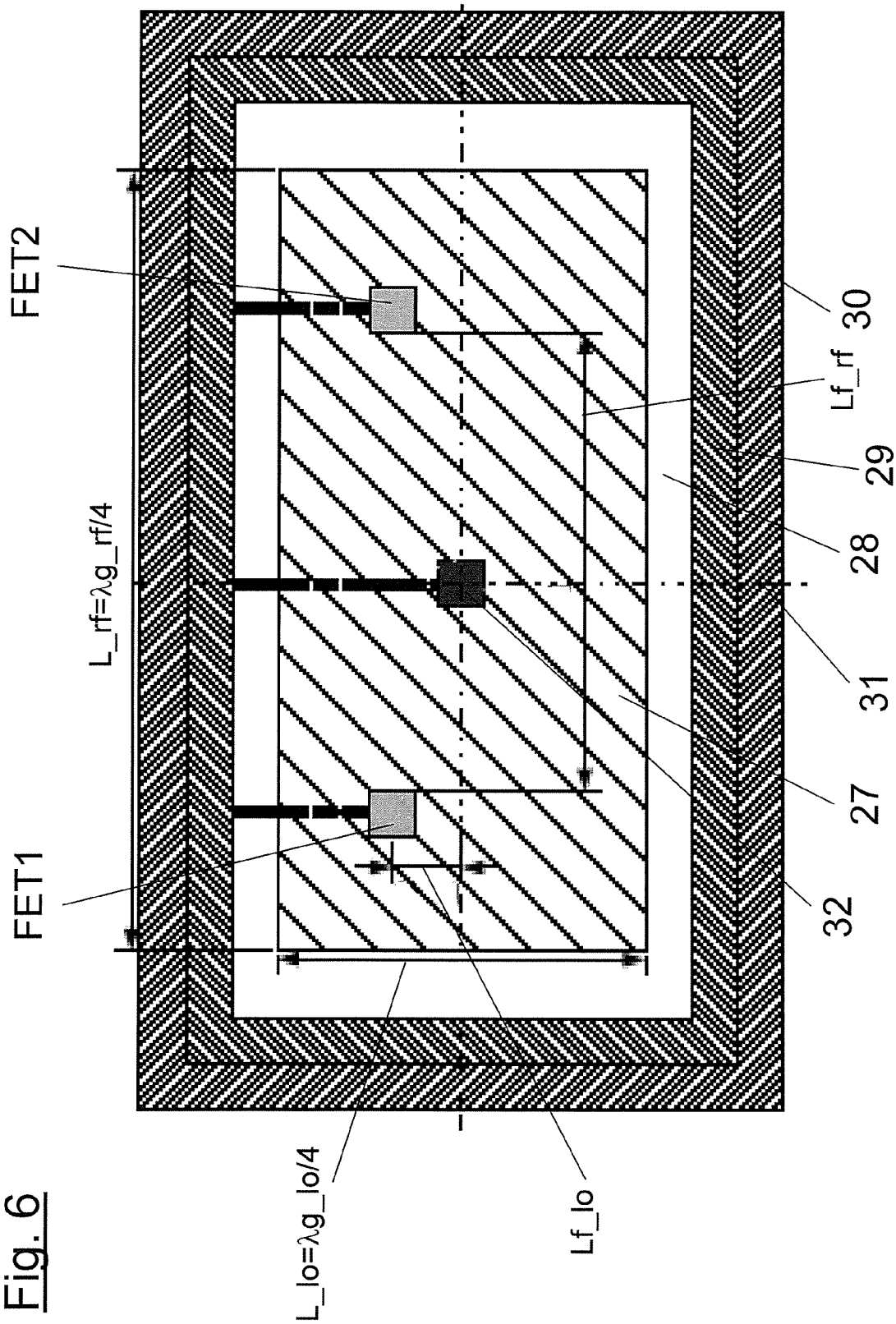
Figure 7:
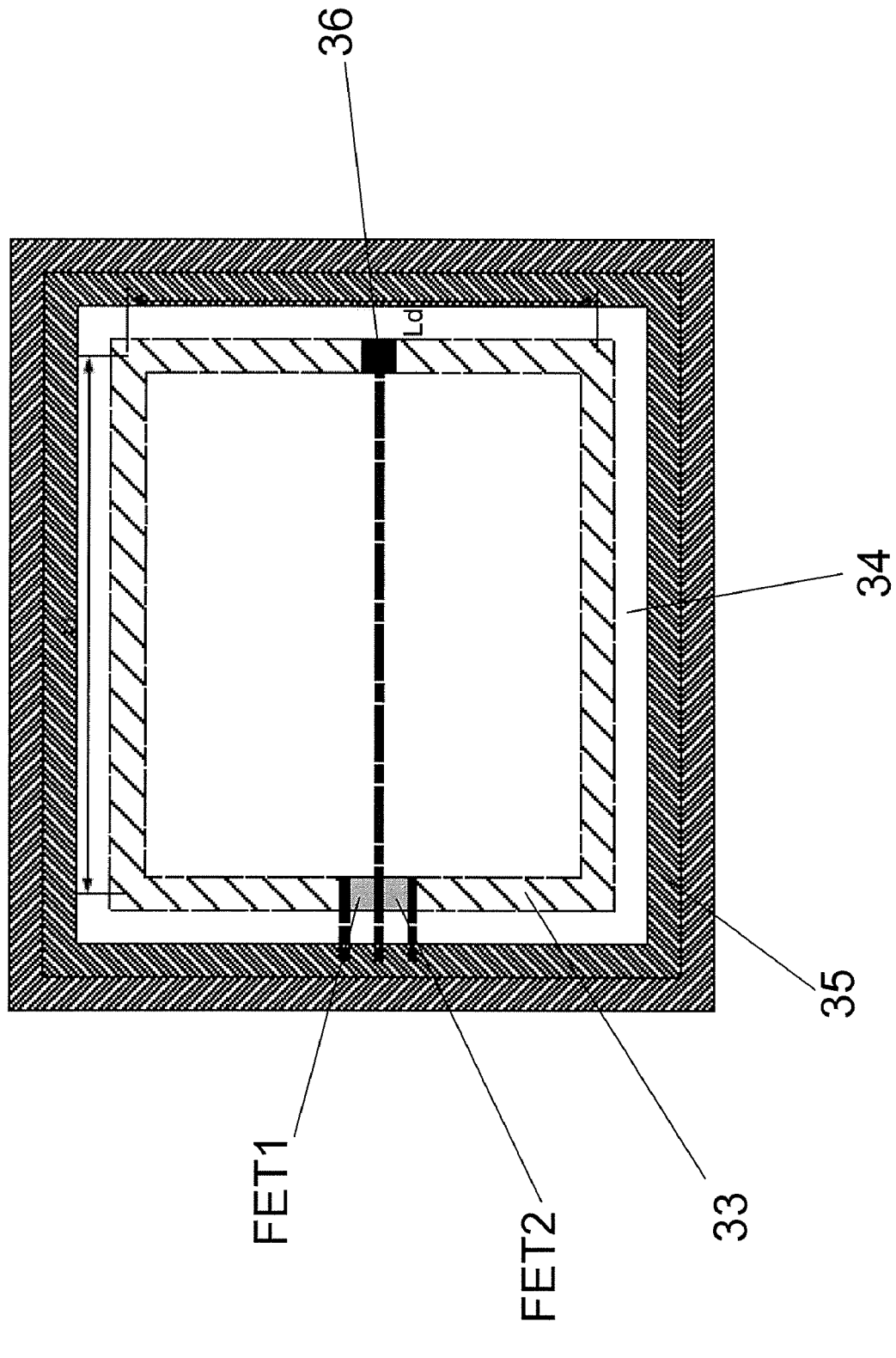
Figure 8:
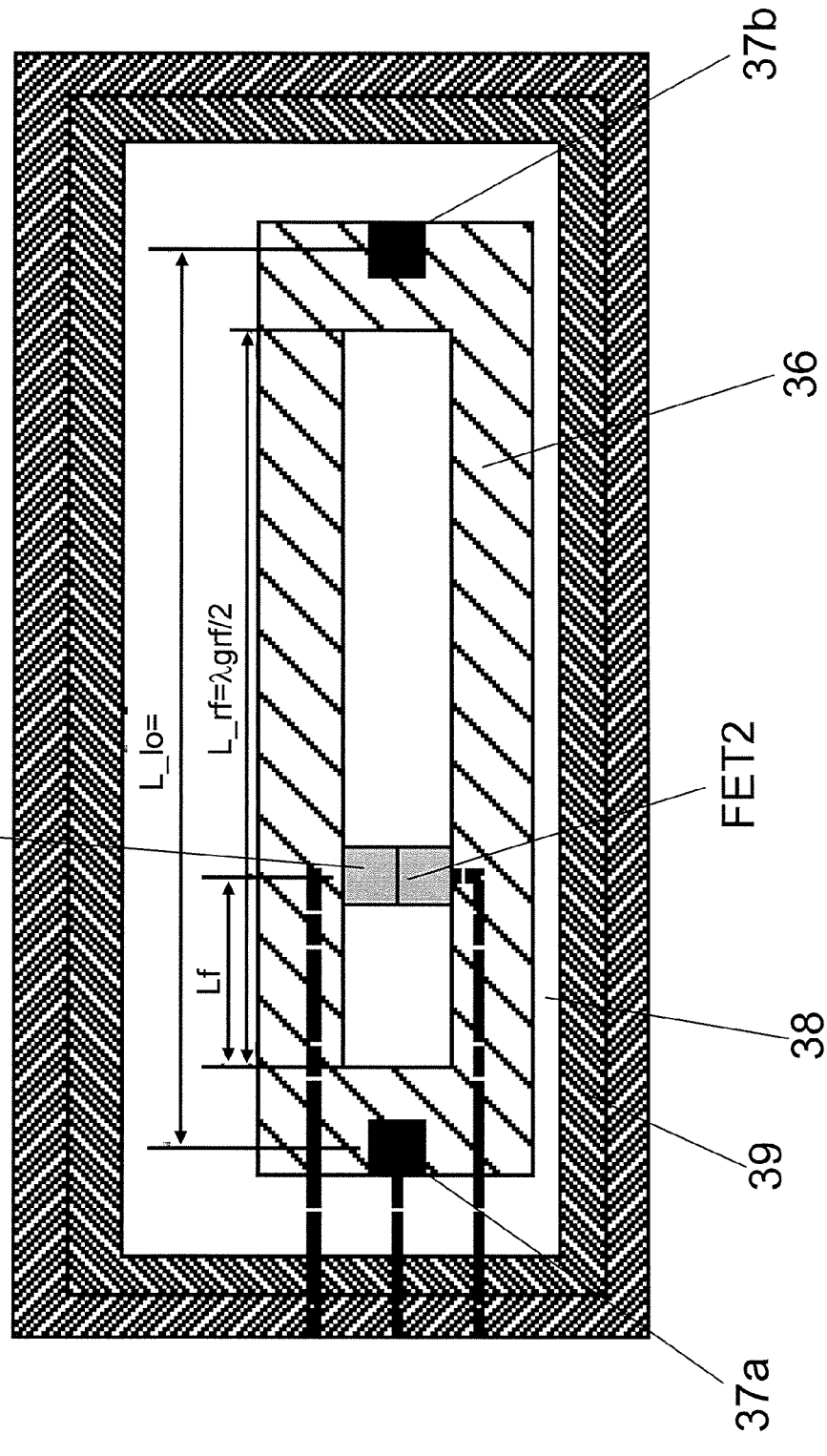
Figure 9:
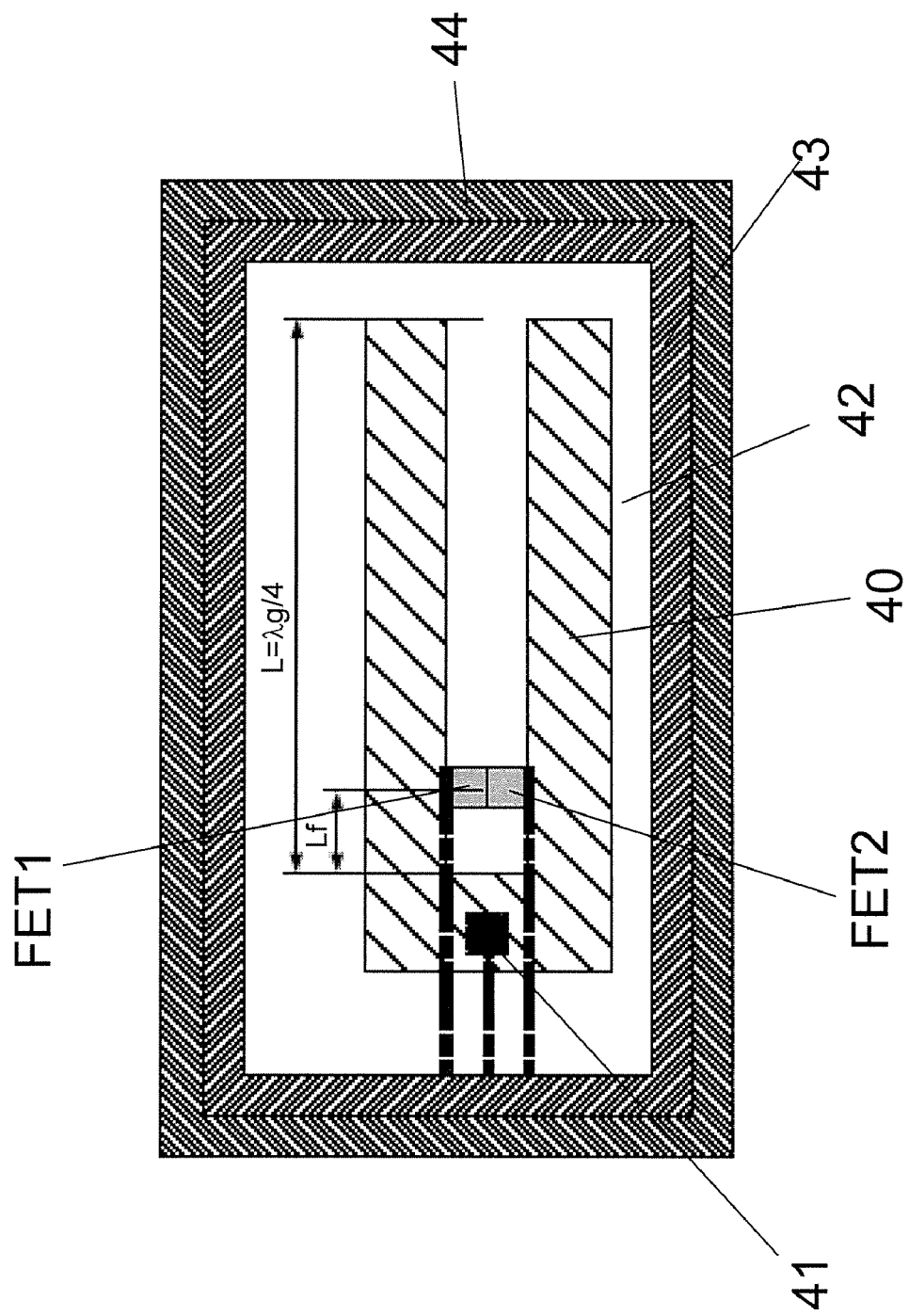
Figure 10:
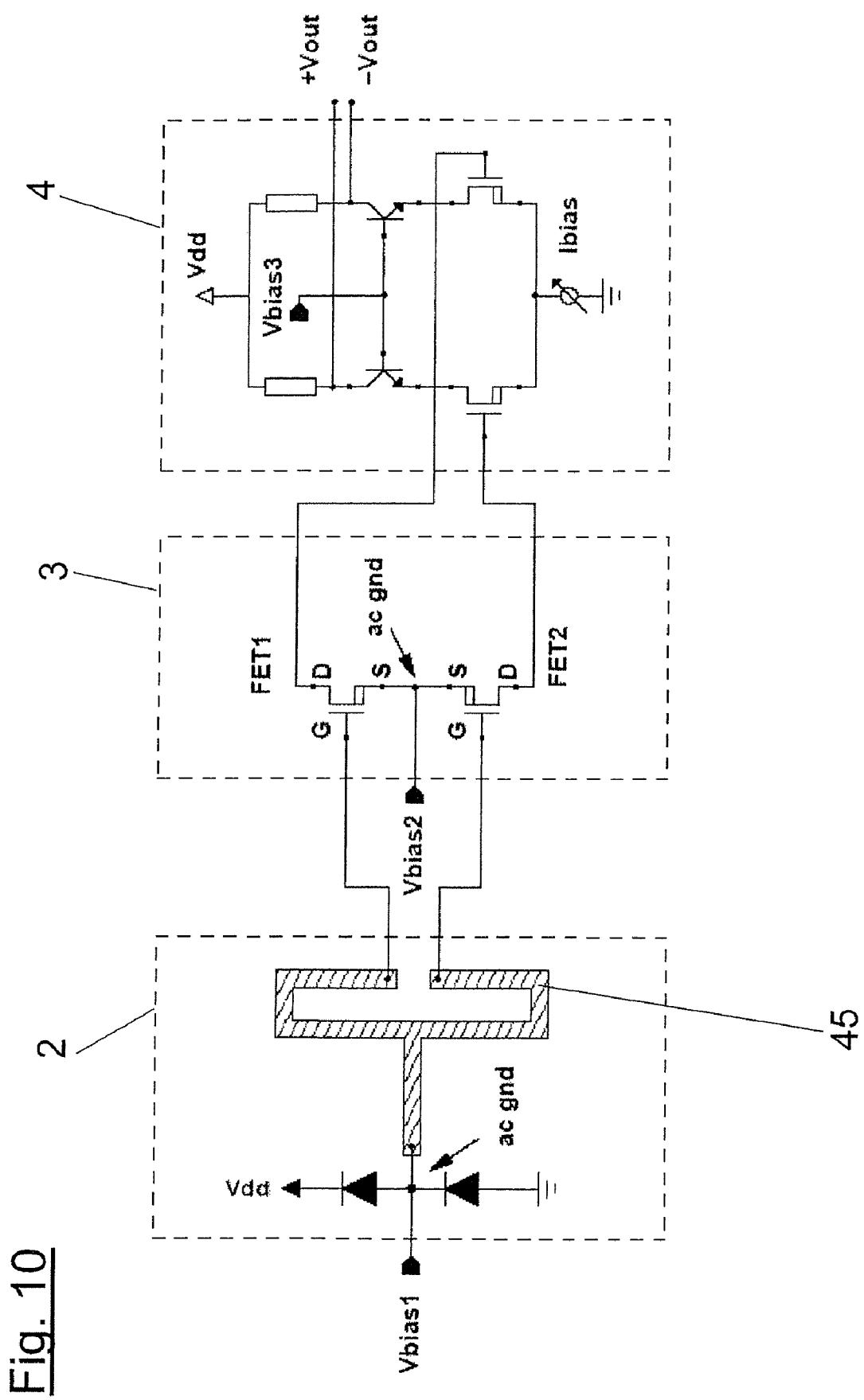
Figure 11:
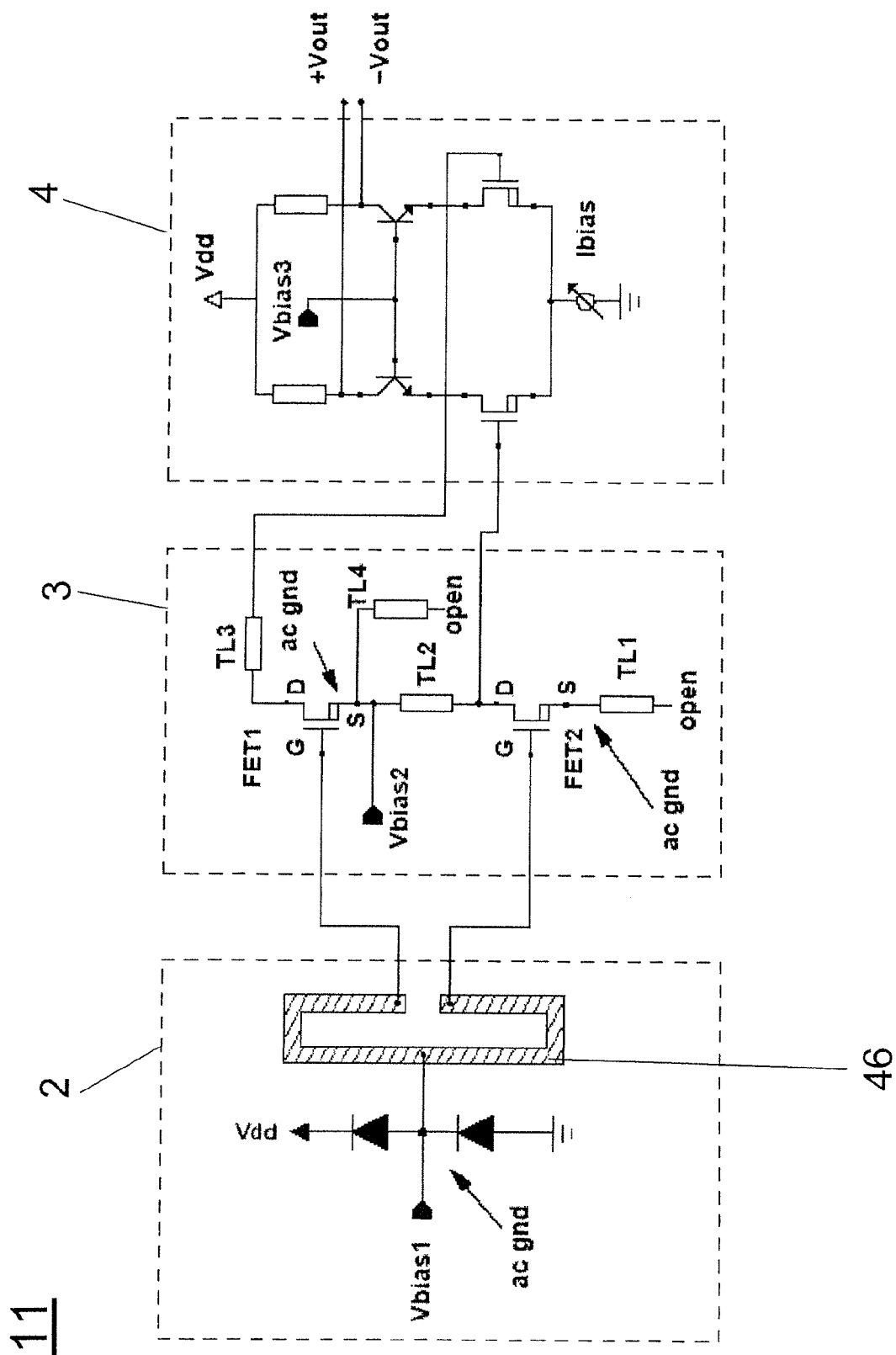
Figure 12:
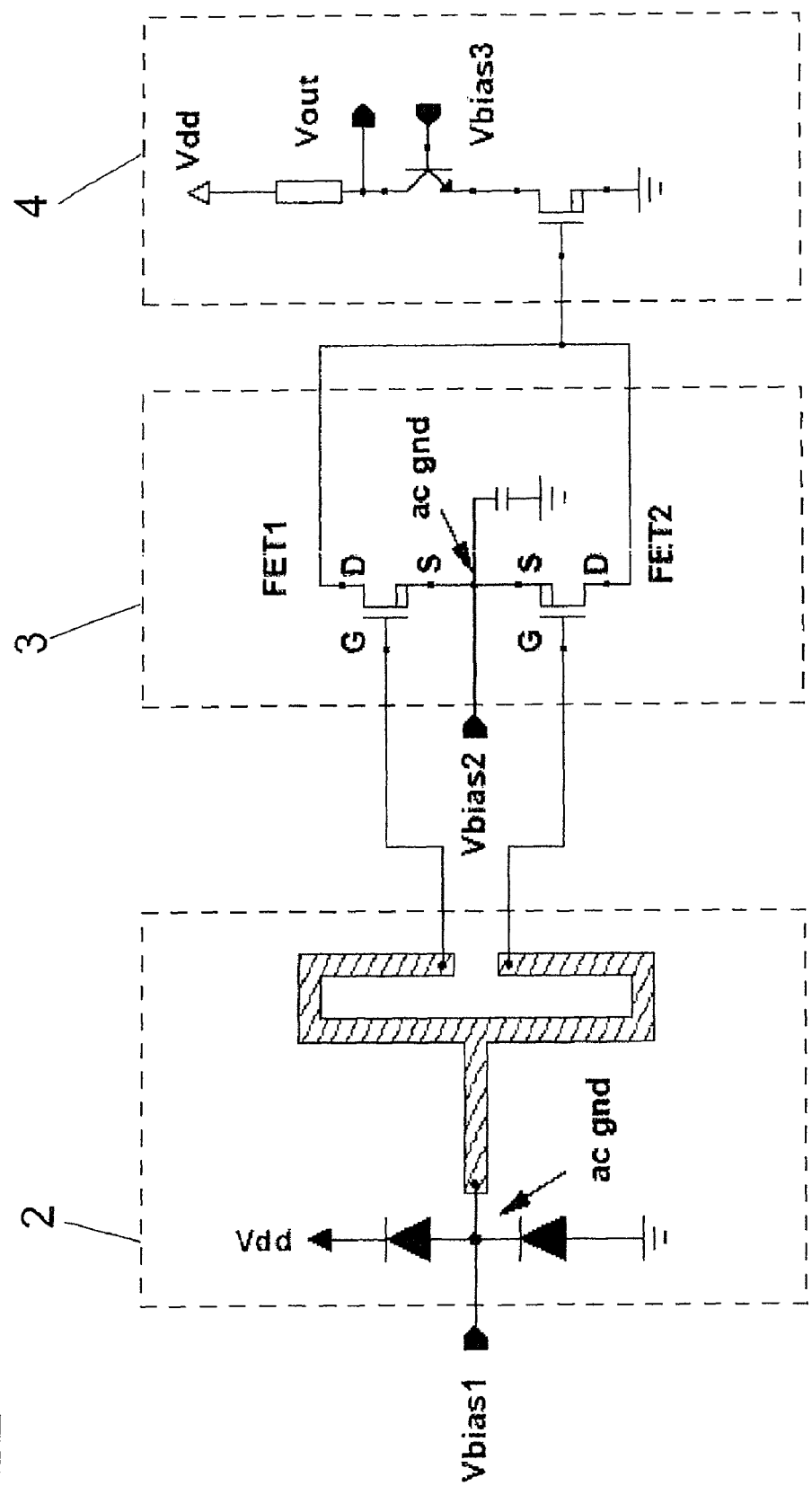
Figure 13:
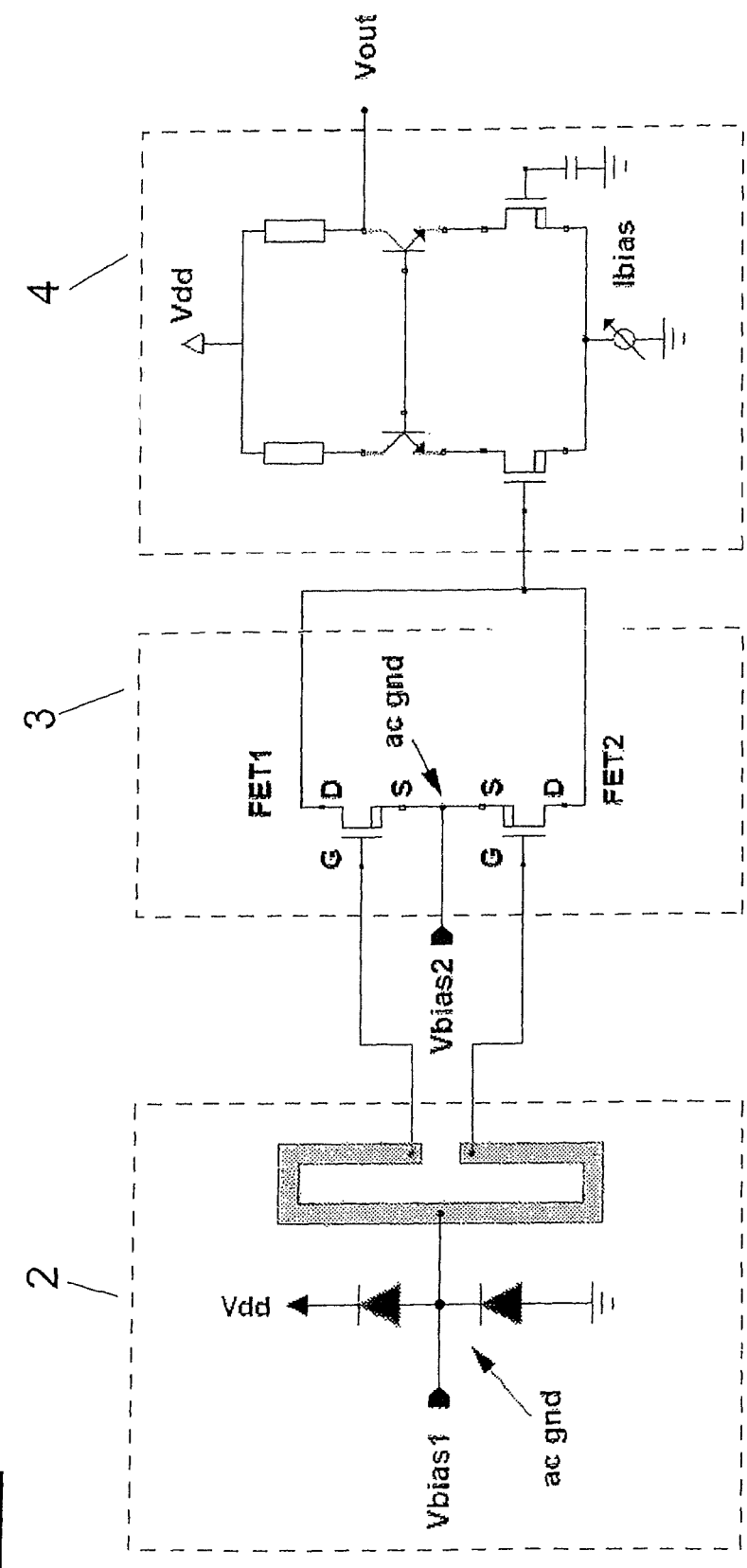
Figure 14:
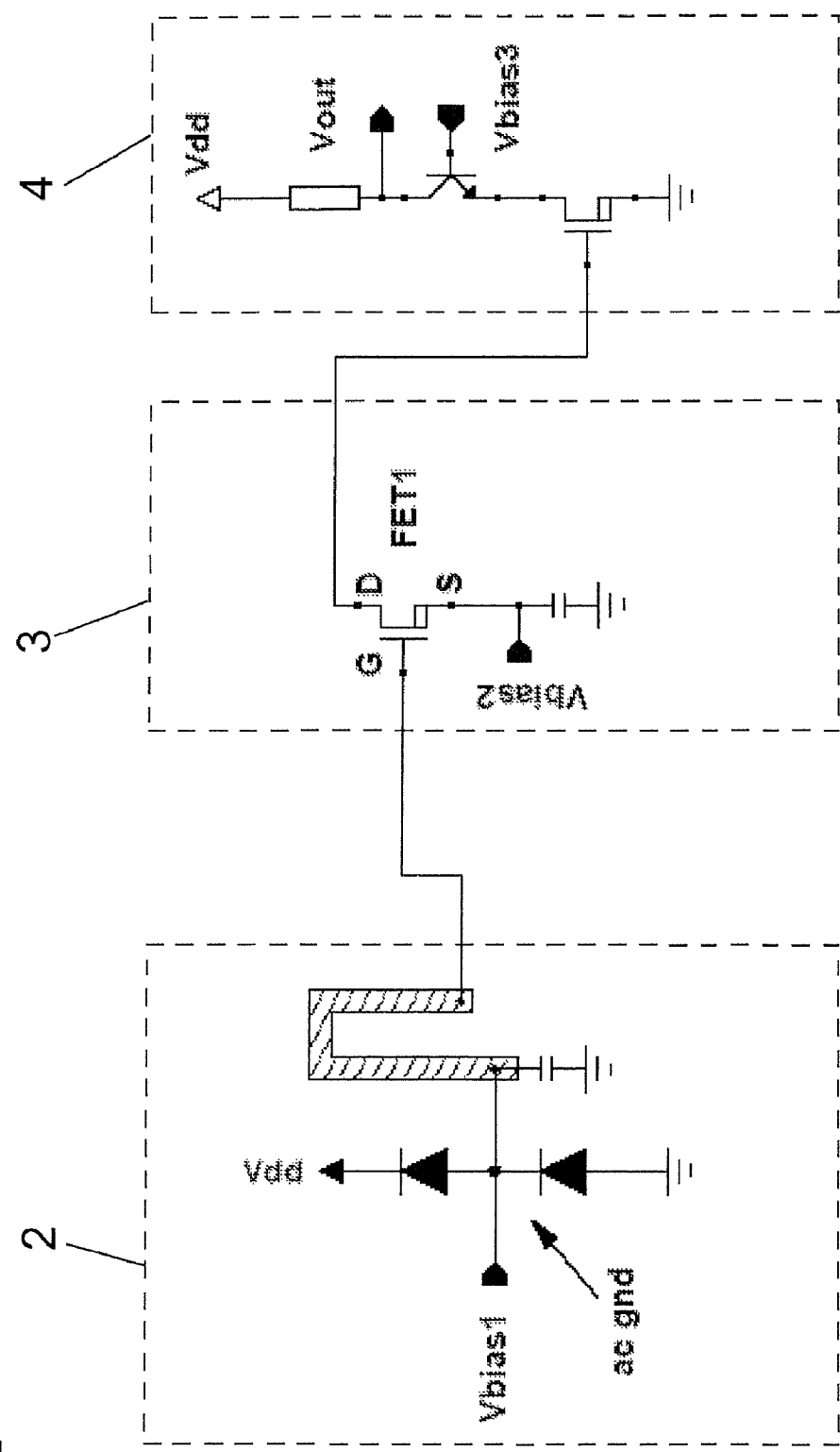
Figure 15:
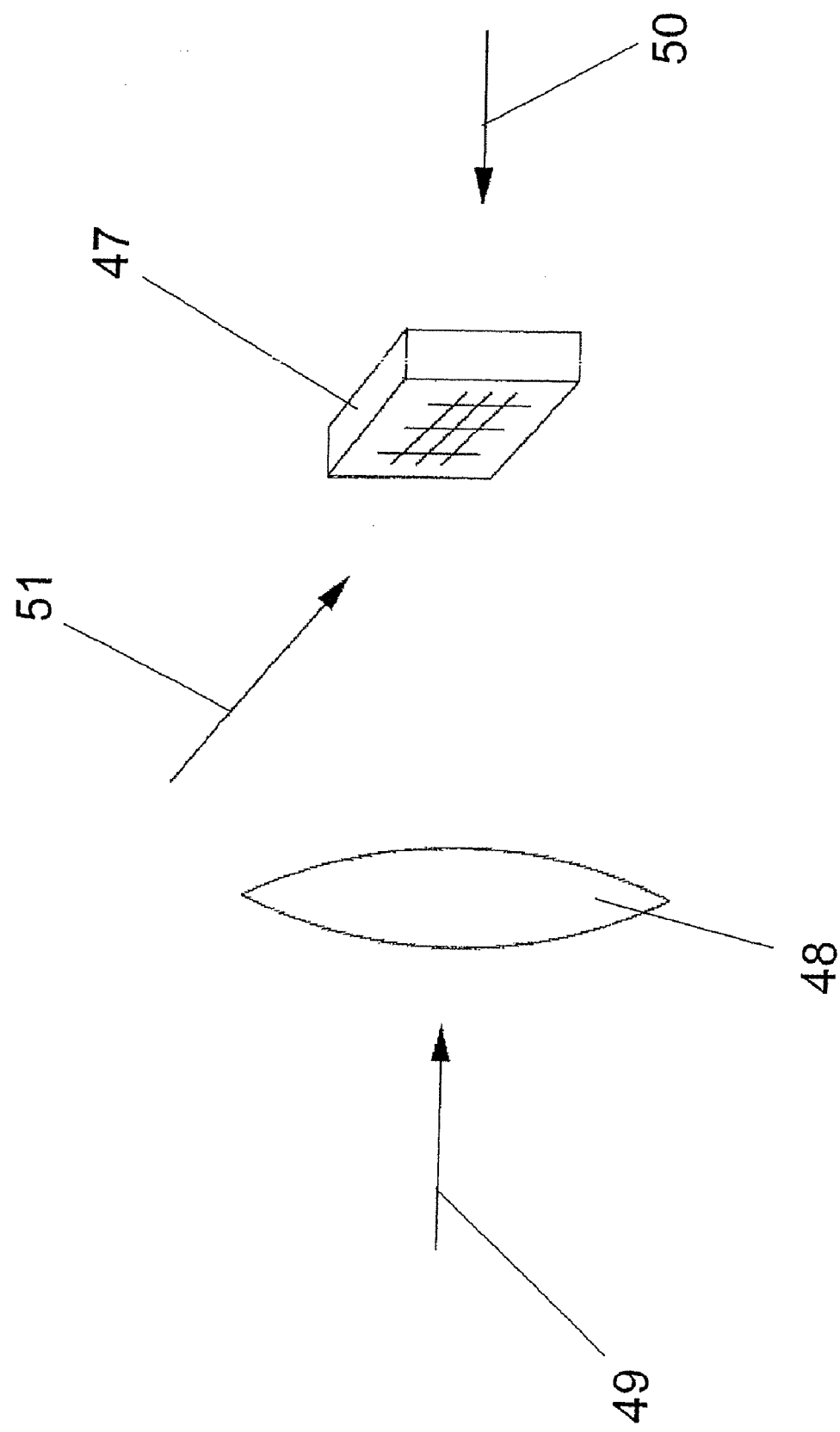
Figure 16:
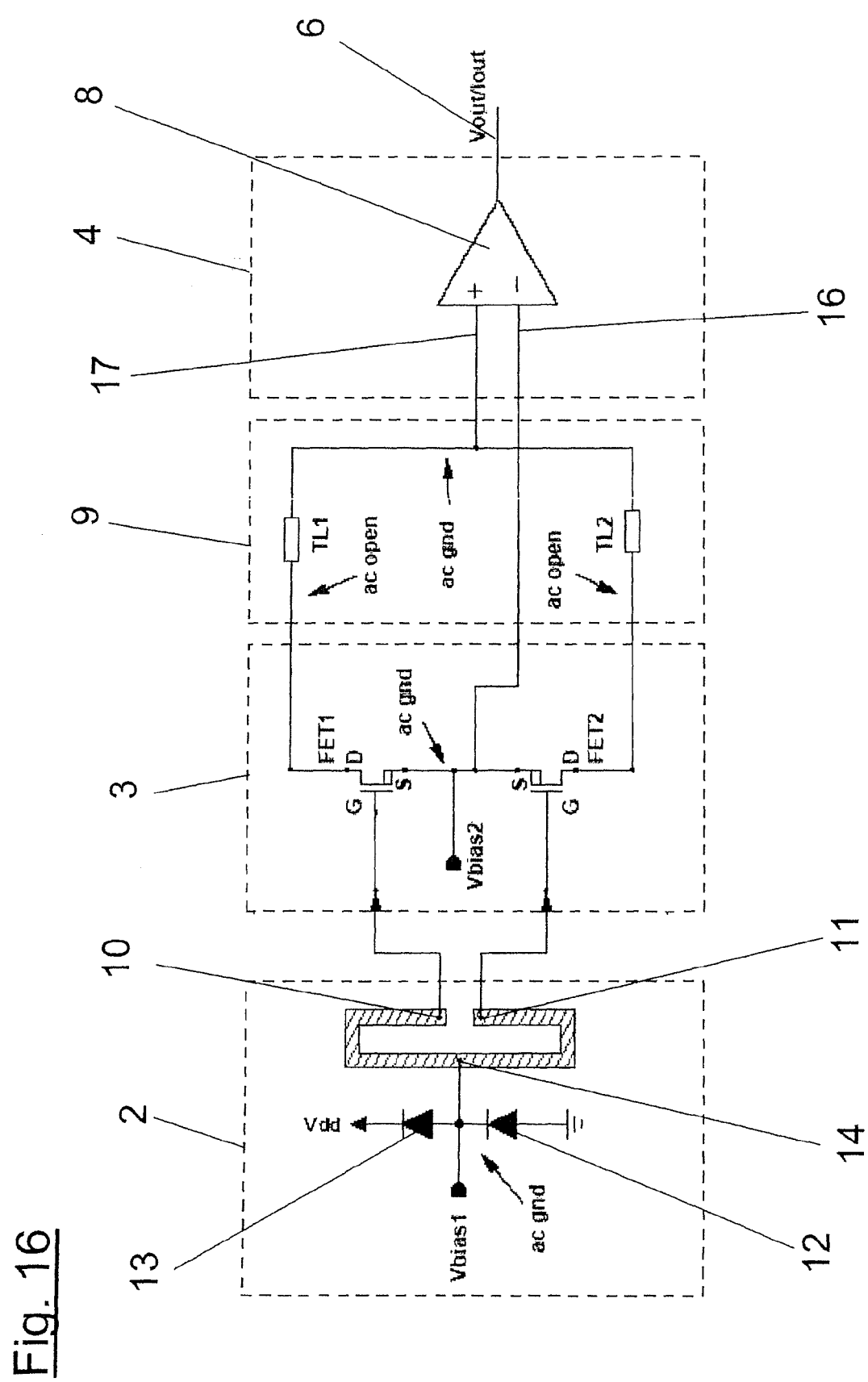

FIG. 1 diagrammatically shows the structure of a component integrated according to the invention, FIG. 2 is a circuit diagram of an embodiment of the invention with two field effect transistors, FIG. 3a diagrammatically shows a plan view of an alternative embodiment of the invention, FIG. 3b shows a view in section through the FIG. 3a chip, FIG. 4 shows a diagrammatic view in section through an MOSFET as is used in embodiments of the invention, FIG. 5 shows a diagrammatic plan view of an embodiment of the invention with an antenna structure and two integrated field effect transistors, FIG. 6 shows an alternative embodiment of the apparatus according to the invention with a patch antenna, FIG. 7 shows an embodiment of the apparatus according to the invention with a ring antenna, FIG. 8 shows an embodiment of the invention with a slot antenna, FIG. 9 shows an embodiment of the invention with a quarter-wave notch antenna, FIG. 10 shows the circuit diagram of an embodiment by way of example of a mixer circuit, FIG. 11 shows an alternative embodiment of the FIG. 10 mixer circuit, FIG. 12 shows a circuit diagram of an embodiment by way of example of a differential mixer circuit, FIG. 13 shows the circuit diagram of a single-ended mixer circuit, FIG. 14 shows the circuit diagram of an embodiment of the invention with a single field effect transistor, FIG. 15 diagrammatically shows the arrangement of a plurality of receiver apparatuses in accordance with embodiments of the invention in a system arrangement, and FIG. 16 diagrammatically shows a component integrated according to the invention as an alternative to the FIG. 1 structure.

DETAILED DESCRIPTION OF THE FIGURES

FIG. 1 diagrammatically shows the structure of an integrated component 1 for the detection of electromagnetic radiation in the THz frequency range. In this case in the illustrated embodiment an antenna structure 2, a detector circuit 3 having a field effect transistor for detection of the radiation received by the antenna and a low-noise amplifier 4 are integrated on a single chip. The incident electromagnetic THz radiation 5 is received by the antenna structure 2, detected by means of the field effect transistor 3 and the output signal of the detector circuit 3 is amplified with the amplifier 4. A baseband output signal 6 is outputted.

FIG. 2 shows a circuit diagram of an embodiment by way of example of an apparatus for the detection of electromagnetic radiation in the THz frequency range having the components identified in FIG. 1 integrated on a single chip. These are an antenna structure 2, in the illustrated embodiment with a folded dipole antenna 7, a mixer circuit 3 with two field effect transistors FET1, FET2 and an integrated amplifier 4 formed by an operational amplifier 8. In addition to the elements 2, 3 and 4 shown in the basic diagram in FIG. 1 the FIG. 2 embodiment has an impedance matching element 9 with two transmission lines TL1, TL2.

The individual elements 2, 3, 4 and 9 of the receiver apparatus according to the invention will now be described in detail. The antenna structure 2 has a folded dipole antenna 7 with a rear-side ground screening. The two ends 10, 11 of the folded dipole antenna are respectively connected to the gates G of the field effect transistors FET1, FET2 of the mixer circuit 3. The biasing of the gates G of the field effect transistors FET1, FET2 is effected by way of a dc voltage source Vbias1 which is firstly connected to the dipole antenna 7 so that biasing of the gates G is effected by way of the dipole antenna 7 and its ends 10, 11. In addition the antenna 7 is provided with a device for protection of the antenna 7 and the field effect transistors FET1, FET2 from electrostatic charges and plasma-induced overvoltages during the production process. The protection device provides a discharge path substantially by way of two diodes 12, 13 connected to ground and a dc voltage source Vdd. The gate bias voltage Vbias1 of the transistors FET1, FET2 is galvanically connected to the point of symmetry 14 of the antenna, at which the induced high frequency (THz) voltage in relation to the ground plane is 0. At that point of symmetry 14 the antenna protection diodes 12, 13 and the bias voltage source Vbias1 can be introduced without detrimental influence on the high frequency properties of the elements 2, 3.

FIG. 3a diagrammatically shows a plan view of the integrated arrangement of FIG. 2 with antenna structure 2 and detector circuit 3. All elements are disposed on a single silicon chip 15. This view corresponds to the plan view of an actually implemented apparatus, the apparatus being shown enlarged and not to scale. It is possible to clearly see an upper metallisation forming the folded dipole antenna 7. Provided in the region of the point of symmetry 14 of the antenna are the gate bias voltage source Vbias1 as well as the protection diodes 12, 13. The field effect transistors FET1, FET2 are provided directly in the region of the dipole ends of the folded dipole antenna, their gates G being connected to the ends 10, 11 of the dipole antenna 7. FIG. 3a shows in broken line the differential outputs 16, 17 of the field effect transistors FET1, FET2 and the feed 18 of the bias voltage Vbias 1. As is apparent from the sectional view already shown in FIG. 3b through the chip, provided over the silicon substrate 15 is a first metallisation 19 which serves as a rear-side ground screening. The upper metallisation forming the antenna structure 7 is insulated from the lower metallisation 19 by an insulating layer 20 of silicon dioxide.

The lower metallisation 19 suppresses the rear-side radiation lobes of the antennas, whereby the gain of the receiver is increased. In addition the lower metallisation 19 provides for screening of the receiver structure in relation to influences of objects behind the substrate 15. The arrangement of the metallisation 19 at a spacing from the upper metallisation 7, wherein the spacing is predetermined by the thickness of the silicon dioxide layer 20, minimises the influences of the ground screening 19 on the antenna band width and the radiation resistance of the antenna. It is apparent that alternatively other layers could be used for the radiation element 7 and the rear-side ground screening 19. The choice of layer is a matter of weighing up between the efficiency of the antenna and the availability of conducting layers in the structure.

The folding of the dipole antenna serves to match the impedance of the antenna at the resonance frequency for the connection of the antenna 7 to the gates G of the field effect transistors FET1, FET2. In dependence on the input impedance of the field effect transistors FET1, FET2 the antenna can have an optional third branch 21 of a width W3 at a spacing S2 from the rest of the dipole arrangement 7 to match the antenna impedance at the resonance frequency to the field effect transistors FET1, FET2.

In addition to permit a dual-mode operation of the antenna, that is to say reception of two mutually perpendicularly polarised waves at the same time, a monopole 22 can be provided at the point of symmetry 14 of the antenna. By adaptation of the length Lm of the monopole it is possible to adjust the resonance frequency of the second mode without influencing the resonance frequency of the folded dipole antenna 7. In that way the THz signal to be received and a local oscillator signal can be simultaneously coupled into the antenna 7 and the apparatus can be operated as a mixer.

In the FIG. 2 embodiment of the detector circuit the two field effect transistors are used in a differential circuitry, wherein the sources S of the two transistors FET1, FET2 are connected together and form the first output 16 of the circuit while the two interconnected drains D of the transistors FET1, FET2 form the second output 17.

The gate G of each transistor FET1 and FET2 respectively is connected by way of a capacitance C1 and C2 to the corresponding drains D. In that way the voltage which is at the drains D directly follows the voltage at the gates G of the transistors FET1, FET2. In the illustrated embodiment the two capacitances are capacitors C1, C2 of a capacitance of 150 fF. That circuitry makes it possible to operate the field effect transistors FET1, FET2 as a resistive mixer.

In addition to the external capacitances C1, C2 the field effect transistors FET1, FET2 have intrinsic capacitances of the gate-drain contacts. To increase the intrinsic capacitance of the gate-drain contact, in an embodiment as is diagrammatically shown in FIG. 4 the gate contact 23 is insulated by means of an oxide layer 24 in relation to the substrate 15 and the source contact 25 and the drain contact 26. By extending the gate contact 23 so that it extends spatially over the drain contact 26, as is indicated in FIG. 4 by the broken line and the arrow, the intrinsic capacitance of the gate-drain contact can be increased, which markedly increases the degree of coupling of the voltages of the gate G and the drain D.

In alternative embodiments as are shown in FIG. 16 but also in FIGS. 10 through 14, the capacitances C1, C2 are omitted. With that circuitry the illustrated field effect transistors operate as plasma field effect transistors or resistive mixers.

In the embodiments shown in FIGS. 2 and 16 the sources S of the field effect transistors FET1, FET2 have an improved ac ground ac gnd. The drains D of the field effect transistors FET1, FET2 are connected by way of a respective transmission line TL1, TL2 to the input of a differential amplifier 8.

In the FIG. 16 embodiment the field effect transistors FET1, FET2 are so constructed and connected that they operate as plasma field effect transistors. For that purpose two boundary conditions are fulfilled by the selection of the field effect transistors FET1, FET2 and the circuitry thereof:

1. The THz signal received by the antenna is fed into the field effect transistors FET1, FET2 by way of the gate-source contact. In order to comply with that boundary condition the sources S of the transistors FET1, FET2 are connected to an ac ground which provides that a 'short-circuit' occurs between the gate G and the source S for the plasma wave propagated in the channel of the respective field effect transistor FET1, FET2.

2. The source-drain contact has a high impedance at the THz target frequency. That is so great that the drain D appears to be an open line for the plasma wave. For that purpose the transmission lines TL1, TL2 connected to the gates are so selected that they afford an impedance that is as high as possible at the THz target frequency. Those terminations of the drains D of the field effect transistors FET1, FET2 are therefore also referred to as an 'open drain' or noted 'ac open' in the circuit diagram.

FIG. 5 shows an alternative embodiment of the detection apparatus with a folded dipole antenna 7' with three branches. It will be clearly seen from this Figure how the field effect transistors FET1', FET2' are integrated into the antenna structure. The ends 10', 11' of the dipole antenna 7' are connected to the drains D1, D2 of the transistors FET1', and FET2' respectively. In that case the two transistors FET1', FET2' share a common source contact instead of the sources being made from two discrete contacts and subsequently connected together.

FIGS. 6 through 9 show views from above on to other embodiments of integrated antenna and transistor structures. FIG. 6 shows a patch antenna 27 which again is arranged as an uppermost metallisation over an insulating layer 28 of silicon dioxide and a metallic screening 29 on a substrate 30. For the patch antenna 27 the lower metallisation 29 serves as a ground plane. The field effect transistors FET1, FET2 are driven as before differentially by the patch antenna 27 as they are arranged on opposite sides of the axis of symmetry 31 of the antenna 27. The transistors FET1, FET2 are at different spacings from the axis of symmetry 31 so that the patch antenna 27 can be operated in the dual-mode manner. As the patch antenna is in the form of a rectangle of different side lengths, it is resonant for two frequencies or frequency bands so that the patch antenna is also suitable as a dual band antenna for receiving a THz signal and a local oscillator signal. As before there are provided diodes for protection of the structure from overvoltages and a terminal for the gate bias voltage at the point of symmetry 32 of the patch antennas 27.

FIG. 7 shows a ring antenna 33. In the illustrated embodiment the ring antenna 33 is a full wavelength ring antenna, the periphery of the ring corresponding equal to a quarter of the wavelength of the THz target frequency in the propagation medium. In the illustrated embodiment the ring antenna is also provided with a ground 35 which is under the antenna and is insulated by a silicon dioxide layer 34. As in the case of the FIG. 3a dipole antenna the ground 35 permits a dual-mode operation of the antenna. The field effect transistors FET1, FET2 are arranged at the antenna feed point. Upon differential excitation of the antenna, a virtual ac ground 36 is afforded in relation to the feed point with the field effect transistors FET1, FET2. Protection diodes can be provided as previously at that virtual ground point 36 and the feed voltage of the gates can be connected without influencing the mode characteristics of the antenna.

FIG. 8 shows a half-wave slot antenna 36 again arranged over a ground plane 39 insulated by an insulation layer 38 of silicon dioxide. Protection diodes can be provided at the points of symmetry 37a, 37b, the gate bias voltage can be connected there and an ac ground can be provided at that point by way of a capacitive coupling to the ground plane 39. In the illustrated arrangement a horizontally polarised local oscillator signal provides a common-mode excitation of the antenna while a vertically polarised received THz signal provides a differential excitation.

FIG. 9 shows a notch antenna 40 which is of reduced size in comparison with the half-wave slot antenna of FIG. 8. A two-mode operation can be achieved by use of the notch antenna as a quarter-wavelength patch antenna at the local oscillator frequency. As an equal potential is present in the patch mode at the local oscillator frequency on each side of the slot the field effect transistors FET1, FET2 are excited in the common mode. To excite the horizontally polarised local oscillator mode a high frequency ground of low impedance must be provided, for example by way of a capacitor.

FIGS. 10 through 14 show by way of example alternative embodiments of the receiver circuits, wherein they are illustrated in the form of schematic circuit diagrams. All illustrated circuits each have an antenna structure 2, a detector circuit 3 as well as an amplifier circuit 4 integrated on a single chip, as integration was described hereinbefore for different types of antenna.

FIG. 10 shows an embodiment by way of example of a single-balanced field effect transistor circuit. The dual-band dual-mode antenna 45 receives the local oscillator and THz signals with opposite polarisations, that is to say horizontal and vertical polarisation. The receiver output is the center frequency, that is to say the differential frequency between the THz signal and the local oscillator signal, wherein the dc voltage background representing the overall power of THz power and local oscillator power is suppressed. The output of the detection field effect transistors FET1 and FET2 is connected directly to a differential amplifier comprising a differential NMOS input stage.

FIG. 11 shows by way of example an embodiment of a differential mixer circuit with two plasma field effect transistors. The single-mode dual-band antenna 46 receives the local oscillator and THz signals with the same polarisation but at a differing frequency. The receiver outputs the center frequency (THz frequency minus local oscillator frequency) as well as the overall power as a de voltage offset. Therefore the circuit operates as a power detector and mixer at the same time. It can however also be used as a power detector for circularly polarised radiation. The circuit uses impedance matching elements, that is to say the transmission lines TL1 through TL4 to comply with the boundary conditions described hereinbefore in relation to the FIG. 16 embodiment for operation of the field effect transistors FET1, FET2 as plasma field effect transistors. In particular the open-ended transmission lines TL1 and TL4 comply with the boundary condition for good coupling of the THz signal into the field effect transistors (short-circuit of the gate-source contact for the plasma wave at the THz frequency in the field effect transistor). The transmission lines TL2 and TL3 in contrast fulfil the boundary conditions for the source-drain contact by providing a high THz impedance of the drain, that is to say an 'open'.

FIG. 12 shows a differentially operated mixer circuit with two plasma field effect transistors FET1, FET2 which is similar to the FIG. 16 circuit, wherein the drain outputs are brought together to a single-end output. Such a single-end output can be used to simultaneously amplify the dc voltage and center frequency signals. The receiver output represents the center frequency (THz frequency minus local oscillator frequency), wherein the dc voltage offset reproduces the total received power of the THz and the local oscillator power.

An embodiment of the invention similar to the FIG. 12 embodiment is shown in FIG. 13. In this embodiment a differentially driven mixer circuit is dc coupled to two plasma field effect transistors at the output to suppress the dc voltage components.

FIG. 14 in contrast shows a single-end mixer circuit with a single plasma field effect transistor in which the ac grounds and the boundary conditions for operation of the plasma field effect transistor are afforded only by bypass capacitances.

All the above-described detection or detector circuits are suitable for integration in line-form or matrix-form arrangements (arrays) for imaging applications in which each detector circuit forms a single pixel. Such a matrix arrangement 47 is diagrammatically shown in FIG. 15, wherein the matrix arrangement 47 of the detector circuits is provided at the focal point of an optical imaging system 48 which focuses the incident THz signal 49 on the matrix 47. At the same time the local oscillator signal is irradiated from the rear at 50 or from the front at 51. Such an application is suitable for example for security applications, in particular in relation to people or baggage control.

For the purposes of the original disclosure it is pointed out that all features as can be seen by a man skilled in the art from the present description, the drawings and the claims, even if they are described in specific terms only in connection with certain other features, can be combined both individually and also in any combinations with others of the features or groups of features disclosed here insofar as that has not been expressly excluded or technical aspects make such combinations impossible or meaningless. A comprehensive explicit representation of all conceivable combinations of features is dispensed with here only for the sake of brevity and readability of the description.

While the invention has been illustrated and described in detail in the drawings and the preceding description that illustration and description is only by way of example and is not deemed to be a limitation on the scope of protection as defined by the claims. The invention is not limited to the disclosed embodiments.

Modifications in the disclosed embodiments are apparent to the man skilled in the art from the drawings, the description and the accompanying claims. In the claims the word 'have' does not exclude other elements or steps and the indefinite article 'a' does not exclude a plurality. The mere fact that certain features are claimed in different claims does not exclude the combination thereof References in the claims are not deemed to be a limitation on the scope of protection.

The invention claimed is:

1. Apparatus for the detection of electromagnetic radiation in the THz frequency range comprising at least one field effect transistor (FET1, FET2) which has a source (S), a drain (D), a gate (G), a gate-source contact, a source-drain channel and a gate-drain contact, and
   an antenna structure (2),
   wherein the at least one field effect transistor (FET1, FET2) is connected to the antenna structure (2) such that an electromagnetic signal received by the antenna structure (2) in the THz frequency range is fed into the at least one field effect transistor (FET1, FET2) by way of the gate-source contact, and
   wherein the field effect transistor (FET1, FET2) and the antenna structure (2) are arranged together on a single substrate,
   wherein the gate (G) has a gate contact and the drain (D) has a drain contact,
   wherein the gate contact and the drain contact are connected together by way of an external capacitance (C1, C2), and the gate-drain contact has an intrinsic capacitance, so that a voltage at the gate (G) follows a voltage at the drain (D).

2. Apparatus as set forth in claim 1 characterised in that the field effect transistor (FET1, FET2) and the antenna structure (2) are monolithically integrated on a single chip.

3. Apparatus as set forth in claim 1 characterised in that the antenna structure (2) has a connection connected to the gate (G) of the field effect transistor (FET1, FET2).

4. Apparatus as set forth in claim 1 characterised in that said source-drain channel has a high impedance in the THz frequency range.

5. Apparatus as set forth in claim 4 characterised in that the impedance of said source-drain channel in the THz frequency range is greater than $1 M\Omega$, wherein the flat contact and the drain contact are connected together by way of an external capacitance (11, C2) and/or gate drain contact has an intrinsic capacitance, so that a voltage at the gate (G) follows a voltage at the drain (D).

6. Apparatus as set forth in claim 1 characterised in that the gate-drain contact has an intrinsic capacitance so that the voltage at the gate (G) follows the voltage at the drain (D).

7. Apparatus as set forth in claim 6 characterised in that the gate (G) has a gate contact and the drain (D) has a drain contact, wherein the gate contact for increasing the intrinsic capacitance of the gate-drain contact is arranged over or under the drain contact in such a way that it spatially overlaps therewith.

8. Apparatus as set forth in claim 1 characterised in that the drain (D) of the field effect transistor (FET1, FET2) is connected to an impedance matching element (TL1, TL2), being a transmission line.

9. Apparatus as set forth in claim 1 characterised in that it has two field effect transistors (FET1, FET2).

10. Apparatus as set forth in claim 9 characterised in that the field effect transistors (FET1, FET2) are connected in series, the drain (D) of a first transistor being connected to the source (S) of a second transistor.

11. Apparatus as set forth in claim 9 characterised in that the field effect transistors (FET1, FET2) are connected in parallel, the sources (S) of the two field effect transistors (FET1, FET2) being connected together.

12. Apparatus as set forth in claim 11 also including an ac ground (ac gnd) and characterised in that the sources (S) are connected to said ac ground (ac gnd).

13. Apparatus as set forth in claim 1 characterised in that the antenna structure (2) has two mutually different receiving bands.

14. A THz heterodyne receiver having at least one apparatus as set forth in claim 1.

15. An imaging system having at least one apparatus as set forth in claim 1.

16. Apparatus for the detection of electromagnetic radiation in the THz frequency range comprising at least one field effect transistor (FET1, FET2) which has a source (S), a drain (D), a gate (G), a gate-source contact, a source-drain channel and a gate-drain contact, and an antenna structure (2), wherein the field effect transistor (FET1, FET2) is so connected to the antenna structure (2) that an electromagnetic signal received by the antenna structure (2) in the THz frequency range is fed into the field effect transistor (FET1, FET2) by way of the gate-source contact, and wherein the field effect transistor (FET1, FET2) and the antenna structure (2) are arranged together on a single substrate, characterised in that the gate (G) has a gate contact and the drain (D) has a drain contact, wherein the gate contact and the drain contact are connected together by way of an external capacitance (C1, C2) so that the voltage at the gate (G) follows the voltage at the drain (D).

17. Apparatus as set forth in claim 16 characterised in that the drain (D) has a drain contact, the drain contact being connected directly to the antenna structure (2).

18. Apparatus as set forth in claim 16 characterised in that the capacitance is greater than 1 fF.

19. Apparatus for the detection of electromagnetic radiation in the THz frequency range comprising two field effect transistors (FET1, FET2) each of which has a source (S), a drain (D), a gate (G), a gate-source contact, a source-drain channel and a gate-drain contact, and an antenna structure (2), wherein the field effect transistors (FET1, FET2) are connected to the antenna structure (2) that an electromagnetic signal received by the antenna structure (2) in the THz frequency range is fed into the field effect transistors (FET1, FET2) by way of the gate-source contact, and wherein the field effect transistors (FET1, FET2) and the antenna structure (2) are arranged together on a single substrate, characterised in that the antenna structure (2) has two terminals (10, 11) respectively connected to the gate (G) of either of said two field effect transistors (FET1, FET2) so that the two field effect transistors (FET1, FET2) are differentially driven, and wherein the drains (D) of the two field effect transistors (FET1, FET2) are connected together.

20. Apparatus for the detection of electromagnetic radiation in the THz frequency range comprising at least one field effect transistor (FET1, FET2) which has a source (S), a drain (D), a gate (G), a gate-source contact, a source-drain channel and a gate-drain contact, and an antenna structure (2), wherein the at least one field effect transistor (FET1, FET2) is connected to the antenna structure (2) such that an electromagnetic signal received by the antenna structure (2) in the THz frequency range is fed into the at least one field effect transistor (FET1, FET2) by way of the gate-source contact, and wherein the field effect transistor (FET1, FET2) and the antenna structure (2) are arranged together on a single substrate, also including a flat (13) having a gate contact and wherein the drain (D) has a drain contact, wherein the gate-drain contact has an intrinsic capacitance, so that a voltage at the gate (G) follows a voltage at the drain (D).

* * * * *

UNITED STATES PATENT AND TRADEMARK OFFICE
CERTIFICATE OF CORRECTION

PATENT NO. : 8,330,111 B2
APPLICATION NO. : 12/810031
DATED : December 11, 2012
INVENTOR(S) : Erik Ojefors et al.

It is certified that error appears in the above-identified patent and that said Letters Patent is hereby corrected as shown below:

Column 3, lines 16-18, are spaced

"Phys Let, volume 71, No 15, pages 2465 through 2468, October 1993, and M. Dyakonov and
 M Shur, "Plasma Wave Electronics: Novel Terahertz"

Column 3, lines 16-18, should be spaced

-- Phys Let, volume 71, No 15, pages 2465 through 2468, October 1993, and M. Dyakonov and M. Shur, "Plasma Wave Electronics: Novel Terahertz Devices using Two Dimensional Electron Fluid, IEEE --

Column 10, line 55, reads "the overall power as a de voltage offset. Therefore the circuit"
          should read -- the overall power as a dc voltage offset. Therefore the circuit --

Signed and Sealed this
Twenty-ninth Day of January, 2013

David J. Kappos
*Director of the United States Patent and Trademark Office*